United States Patent [19]

Kuroda et al.

[11] Patent Number: 5,369,318
[45] Date of Patent: Nov. 29, 1994

[54] LEVEL TRANSLATOR CAPABLE OF HIGH SPEED OPERATION

[75] Inventors: Tadahiro Kuroda, Kawasaki; Shinji Fujii, Yokohama; Masahiro Kimura, Yokohama; Kazuhiko Kasai, Yokohama, all of Japan

[73] Assignee: Kabushiki Kaisha Toshiba, Tokyo, Japan

[21] Appl. No.: 80,109

[22] Filed: Jun. 23, 1993

[30] Foreign Application Priority Data

Jun. 26, 1992 [JP] Japan .................. 4-168921

[51] Int. Cl.⁵ .................................... H03K 19/0175
[52] U.S. Cl. .................................... 326/66; 326/21; 327/333
[58] Field of Search ............ 307/475, 443, 446, 296.1, 307/296.6, 296.7

[56] References Cited

U.S. PATENT DOCUMENTS

| | | | |
|---|---|---|---|
| 4,623,802 | 11/1986 | Cline et al. | 307/296.6 |
| 4,763,021 | 8/1988 | Stickel | 307/475 |
| 5,047,657 | 9/1991 | Seevinck et al. | 307/475 |
| 5,105,102 | 4/1992 | Shioda | 307/443 |
| 5,227,865 | 7/1993 | Moriizumi et al. | 307/536 |
| 5,268,872 | 12/1993 | Fujii et al. | 365/189.07 |

*Primary Examiner*—Edward P. Westin
*Assistant Examiner*—Jon Santamauro
*Attorney, Agent, or Firm*—Finnegan, Henderson, Farabow, Garrett & Dunner

[57] ABSTRACT

The output terminal of an ECL circuit is directly connected to the input terminal of a CMOS output circuit. The CMOS output circuit has a transistor which sets the threshold voltage of the CMOS output circuit nearly midway between ECL logic levels. A first reference voltage generating circuit has substantially the same arrangement as the CMOS output circuit and outputs a potential midway between CMOS logic levels as a first reference voltage Vref1. The first reference voltage Vref1 is made variable. A second reference voltage generating circuit has substantially the same arrangement as the ECL circuit and outputs a potential which is midway between the ECL logic levels as a second reference voltage Vref2. A comparator makes a comparison between the first and second reference voltages Vref1 and Vref2 and controls the first reference voltage generating circuit and the CMOS output circuit so that the first and second reference voltages Vref1 and Vref2 may become equal to each other.

12 Claims, 3 Drawing Sheets

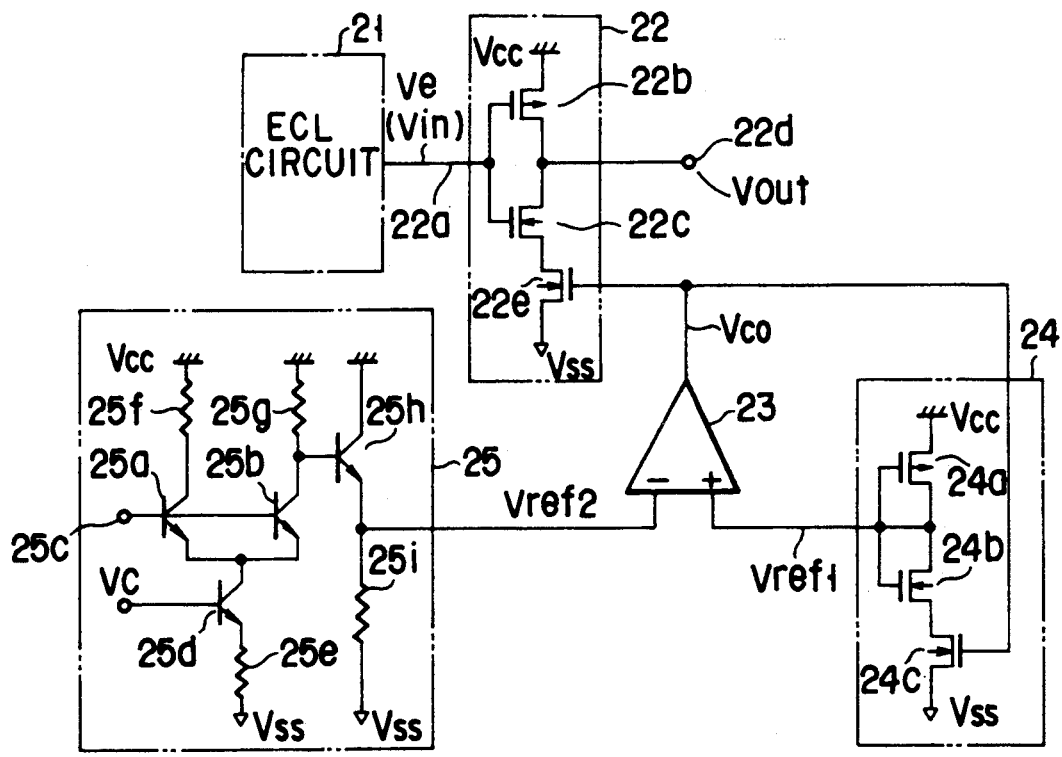
F I G. 1
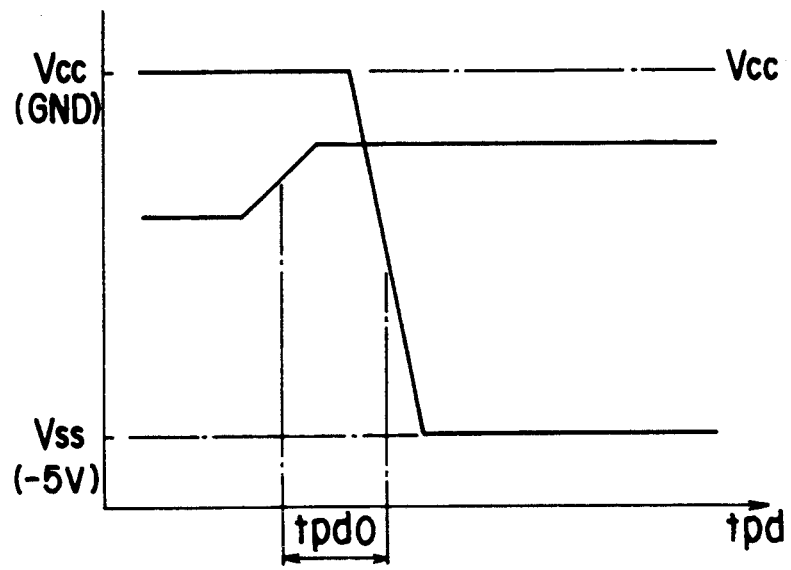
F I G. 2

LEVEL TRANSLATOR CAPABLE OF HIGH SPEED OPERATION

BACKGROUND OF THE INVENTION

1. Field of the Invention

The present invention relates to a Bi-CMOS logic circuit and, more specifically, to a level translator for translating ECL-level signals to CMOS-level signals.

2. Description of the Related Art

FIG. 6 shows an example of a prior art level translator. An ECL (emitter coupled logic) circuit 11 is a general differential amplifier which is constructed, as shown in FIG. 7, from bipolar transistors 11a to 11e and resistors 11f to 11j. Outputs 11k and 11l of the ECL circuit 11 are coupled to inputs 12a and 12b of a differential amplifier 12, respectively. The differential amplifier 12 is constructed from MOS transistors 12c to 12f and has its output connected to an input of a CMOS output circuit 13 serving as an inverter.

The ECL circuit 11 provides an output signal proportional to the difference between an input voltage Vin applied to the base of the transistor 11a and a reference voltage Vref applied to the base of the transistor 11b. The logical amplitude of output voltages Z, /Z of the ECL circuit 11 is as low as 500 to 800 millivolts. The output voltages of the ECL circuit are, to some extent, amplified by the differential amplifier 12. The output voltages VA of the differential amplifier 12 are subjected to waveform shaping by the CMOS circuit 13 for conversion to CMOS logic levels Vcc and Vss.

In the prior art level translator, an output voltage of the ECL circuit 11 is changed by the differential amplifier 12 and the CMOS output circuit 13 to a CMOS voltage level. For this reason, some delay will occur between the moment that an output voltage is produced by the ECL circuit 11 and the moment that the output voltage is taken from the CMOS output circuit 13.

FIG. 8 shows response waveforms of the prior art level translator. In this figure, the time tpdA is the time required by the differential amplifier 12 to amplify an ECL voltage level, and the time tpdB is the time required by the CMOS to shape an input voltage and change it to a corresponding CMOS voltage level. Thus, the time tpdO it takes to change an ECL voltage level to a CMOS voltage level is tpdO=tpdA+tpdB.

The prior art level translator thus requires a plurality of circuit stages so as to change ECL voltage levels to CMOS voltage levels, with the result that a large amount of delay occurs and difficulty is involved in increasing the speed of the level translation. In addition, the use of the differential amplifier 12 increases the dissipation current and the number of circuit elements used.

To solve the problems, the direct application of output voltages of the ECL circuit11 to the CMOS output circuit 13 may be permitted. The threshold voltages of MOS transistors constructing the CMOS circuit 13 depend, however, upon the manufacturing process and the conditions under which they are used. For this reason, the direct application of ECL voltages, low in logical amplitude, to the CMOS output circuit 13 may cause the possibility of inaccurate level translation.

SUMMARY OF THE INVENTION

It is therefore an object of the present invention to provide a level translation circuit which permits the time required for level translation to be reduced, the number of circuit elements used to be decreased so as to minimize dissipation current, and level translation from ECL voltage levels to CMOS voltage levels to be ensured without being affected by variations in the manufacturing process.

The object of the present invention is attained by a level translation circuit comprising:

a CMOS output circuit having an input terminal, a control signal input terminal, and an output terminal for translating an input voltage at an ECL logic level, directly applied to the input terminal, to an output voltage at a CMOS logic level and outputting the output voltage to the output terminal, the CMOS output circuit having a threshold voltage that is set nearly midway between ECL logic levels in response to a control signal applied to the control signal input terminal;

a first reference voltage generating circuit having a control signal input terminal and an output terminal for generating a voltage proportional to the threshold voltage of the CMOS output circuit as a first reference voltage and outputting it to its output terminal, the first reference voltage generating circuit being responsive to the control signal applied to its control signal input terminal to vary the first reference voltage;

a second reference voltage generating circuit, composed of bipolar transistors, for generating a potential midway between the ECL logic levels as a second reference voltage; and a comparator having a first input terminal connected to receive the first reference voltage output from the first reference voltage generating circuit, a second input terminal connected to receive the second reference voltage output from the second reference voltage generating circuit, and an output terminal connected to the control signal input terminals of the CMOS output circuit and the first reference voltage generating circuit, the comparator making a comparison between the first and second reference voltages to output the control signal for controlling the CMOS output circuit and the first reference voltage generating circuit so that the first and second reference voltages may become equal to each other.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a circuit arrangement illustrating an embodiment of the present invention;

FIG. 2 is a timing chart for use in explanation of the operation of the circuit arrangement shown in FIG. 1;

DETAILED DESCRIPTION OF THE PREFERRED EMBODIMENTS

Figure 3A:
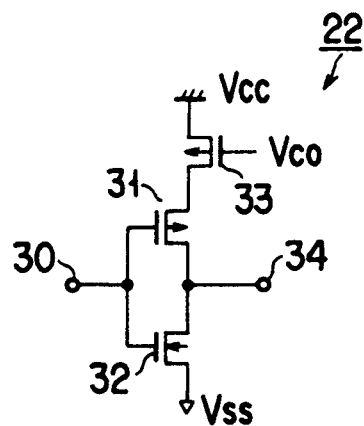
FIGS. 3A and 3B show modifications of the CMOS output circuit shown in FIG. 1.

In FIG. 1, an ECL circuit 21 is arranged to output a voltage Ve (=Vin) at an ECL level. In this case, the ECL circuit 21, unlike the prior art, is not required to output a differential voltage; it may be provided with a single output as is the case with a second reference voltage generating circuit 25 shown in FIG. 1. The ECL-level voltage Ve is directly applied to the input 22a of a CMOS output circuit 22 as an input voltage Vin thereto. The CMOS output circuit 22 comprises an inverter circuit with a variable threshold voltage and provides a CMOS-level signal opposite in logic to the input ECL-level signal.

P-channel and N-channel transistors 22b and 22c, which construct the CMOS output circuit 22, have their gates connected together to the input 22a. The transistor 22b has its source connected to a first voltage source Vcc (ground) and its drain connected to the output 22d of the CMOS output circuit and to the drain of the transistor 22c. The source of the transistor 22c is connected to the drain of an N-channel transistor 22e the source of which is connected to a second voltage source Vss. The second voltage source Vss provides one of voltages −5.0 volts, −5.2 volts and −4.5 volts. In the CMOS output circuit 22, its threshold voltage for discriminating ECL logic levels is varied by controlling the gate voltage of the transistor 22e as will be described later.

A comparator 23 and first and second reference voltage generating circuits 24 and 25 construct an ABC (automated bias circuit) for varying the threshold voltage of the CMOS output circuit 22. The ABC circuit permits the threshold voltage of the CMOS output circuit 22 to be set nearly midway between the ECL logic levels even when changes take place in the manufacturing process and conditions under the present level translation circuit is used.

The comparator 23 has its noninverting input connected to the output of the first reference voltage generating circuit 24 and its inverting input connected to the output of the second reference voltage generating circuit 25. The output of the comparator 23 is connected to the gate of the transistor 22e in the CMOS output circuit 22 and to the gate of a transistor 24c in the first reference voltage generating circuit 24.

The first reference voltage generating circuit 24 generates a first reference voltage Vref1, which is a threshold voltage that depends on the dimensional ratio between the P-channel transistor and the N-channel transistor and is nearly midway between the CMOS logic levels. The first reference voltage generating circuit 24 has the same arrangement as the CMOS output circuit 22 except that the former has its input and output short-circuited. That is, the P-channel and N-channel transistors 24a and 24b have their gates and drains connected together to the noninverting input of the comparator 23. The source of the transistor 24a is connected to the first voltage source Vcc (GND), and the source of the transistor 24b is connected to the drain of the N-channel transistor 24c the source of which is, in turn, connected to the second voltage source Vss (one of −5.0 volts, −5.2 volts, and −4.5 volts). The gate of the transistor 24c is connected to the output of the comparator 23. Consequently, the threshold voltage of the first reference voltage generating circuit is made to vary with the output voltage of the comparator 23. The transistors 24a to 24c in the first reference voltage generating circuit 24 are not required to have the same dimensions as the transistors 22b to 22e in the CMOS output circuit 22, but the circuits 24 and 22 must be set equal to each other in the dimensional ratio between P-channel and N-channel transistors.

The second reference voltage generating circuit 25 generates a second reference voltage Vref2 which is midway between the ECL logic levels. In the circuit 25, transistors 25a and 25b have their bases connected to an input 25c connected to receive the same input signal as that of the ECL circuit 21. The emitters of these transistors 25a and 25b are connected to the collector of a transistor 25d constituting a constant current source. The transistor 25 has its base connected to a constant voltage Vc and its emitter connected to the second voltage source Vss (one of −5.0 volts, −5.2 volts, and −4.5 volts) through a resistor 25e. The transistor 25a has its collector connected to the first voltage source Vcc (GND) through a resistor 25f, while the transistor 25b has its collector connected to the first voltage source Vcc (GND) through a resistor 25g and to the base of a transistor 25h having its collector connected to the first voltage source Vcc and its emitter connected to the second voltage source Vss through a resistor 25i and to the inverting input of the comparator 23. In the present embodiment, the second reference voltage generating circuit 25 is the same in arrangement as the ECL circuit 21 except that the bases of the transistors 25a and 25b are connected together to the input terminal 25c. Thus the detailed description of the ECL circuit 21 is omitted.

In the above arrangement, the comparator 23 makes a comparison between the first and second reference voltages Vref1 and Vref2 from the first and second reference voltage generating circuits 24 and 25 and provides an output voltage Vco corresponding to the difference between Vref1 and Vref2 to the gate of the transistor 22e in the CMOS output circuit 22 and the gate of the transistor 24c in the first reference voltage generating circuit 24. That is, the comparator 23 controls the first reference voltage generating circuit 24 so that the first reference voltage Vref1 may become equal to the second reference voltage Vref2.

Here, the operation of the present level translation circuit when parameters in the integrated circuit manufacturing process therefor were subjected to variations will be discussed. Variations in parameters for the MOS transistors will produce a variation in the first reference voltage Vref1 output from the first reference voltage generating circuit 24 composed of MOS transistors. If, in this case, the first reference voltage Vref1 goes higher than usual, then the potential at the noninverting input of the comparator 23 will go higher than that at its inverting input. As a result, the output voltage Vco of the comparator 23 goes higher than usual. Thus, the resistance of the conduction path of the N-channel transistor 24c supplied with the voltage higher than usual decreases. In comparison in resistance between the P-channel transistor 24a and the N-channel transistors 24b and 24c, the latter are lower than the former. For this reason, the first reference voltage Vref1 output from the first reference voltage generating circuit 24 falls and becomes equal to the second reference voltage Vref2. Besides, since the output of the comparator 23 is connected to the gate of the transistor 22e in the CMOS output circuit 22, the threshold voltage of the CMOS output circuit 22 becomes equal to the first reference voltage Vref1, i.e., the second reference voltage Vref2. Such operations of the ABC circuit permits the threshold voltage of the CMOS output circuit 22 to be set nearly midway between the ECL logic levels.

According to the above embodiment, the threshold voltage of the CMOS output circuit 22 can be set nearly midway between the ECL logic levels even when parameters in the integrated circuit manufacturing process were subjected to variations. Thus, the direct application of a signal at an ECL level from the ECL circuit 21 to the CMOS output circuit 22 can ensure the ECL to CMOS level translation.

Moreover, since ECL-level signals are applied to the CMOS output circuit with no intervening differential amplifier, the delay associated with level translation includes only tpdO as shown in FIG. 2. Thus, fast level translation can be achieved. In addition, the number of devices required for level translation can be decreased, resulting in reduced current dissipation.

Although, in the above embodiment, a single ABC circuit is used to control a single CMOS circuit, this is not restrictive. Controlling a plurality of CMOS output circuits by means of a single ABC circuit would permit a more reduction in current dissipation.

Figure 3B:
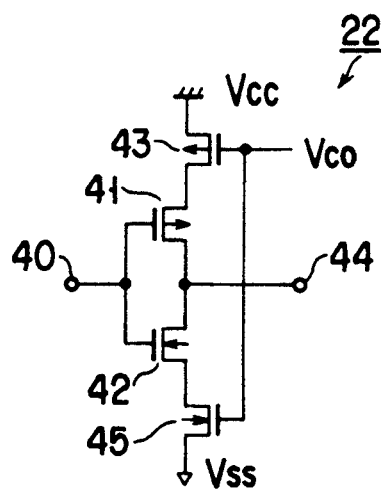

Moreover, the CMOS output circuit 22 is not restricted to the arrangement shown in FIG. 1; it may be modified as shown in FIGS. 3A and 3B.

In FIG. 3A, an input terminal 30 is connected to the gates of P-channel and N-channel transistors 31 and 32. The source of the transistor 31 is connected to the drain of a P-channel transistor 33 having its source connected to the first voltage source Vcc and its gate connected to the output of the comparator 23. The drains of the transistors 31 and 32 are connected together to an output terminal 34. The source of the transistor 32 is connected to the second voltage source Vss (−5.0 volts, −5.2 volts, or −4.5 volts).

In FIG. 3B, on the other hand, an input terminal 40 is connected to the gates of P-channel and N-channel transistors 41 and 42. The source of the transistor 41 is connected to the drain of a P-channel transistor 43. The transistor 43 has its source connected to the first voltage source Vcc and its gate connected to the output of the comparator 23. The drains of the transistors 41 and 42 are connected together to an output terminal 44. The source of the transistor 42 is connected to the drain of an N-channel transistor 45. The transistor 45 has its gate connected to the output of the comparator 23 and its source connected to the second voltage source Vss (−5.0 volts, −5.2 volts, or −4.5 volts).

When use is made of such a modified CMOS output circuit as shown in FIG. 3A or 3B, the first reference voltage generating circuit 24 should also be modified identically to that CMOS output circuit used. In this case as well, of course, its input and output are short-circuited.

Figure 4A:
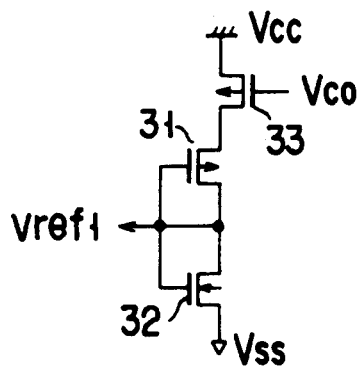
FIGS. 4A and 4B show modifications of the first reference potential generating circuit shown in FIG. 1.
Figure 4B:
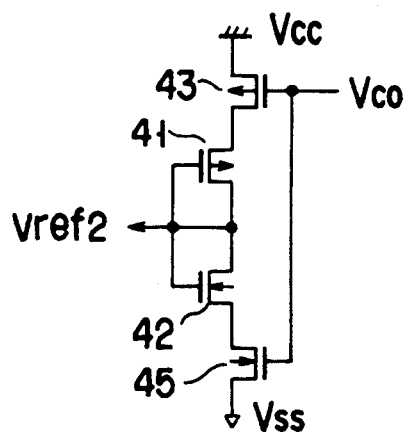

FIG. 4A shows a modification of the first reference voltage generating circuit 24, which corresponds to the CMOS output circuit of FIG. 3A. Transistors 31 and 32 have their gates connected together and their drains connected together. FIG. 4B shows the other modification of the first reference voltage generating circuit 24, which corresponds to the CMOS output circuit of FIG. 3B. Transistors 41 and 42 have their gates connected together and their drains connected together. In FIGS. 4A and 4B, like reference numerals are used to denote corresponding parts to those in FIGS. 3A and 3B.

Figure 5A:
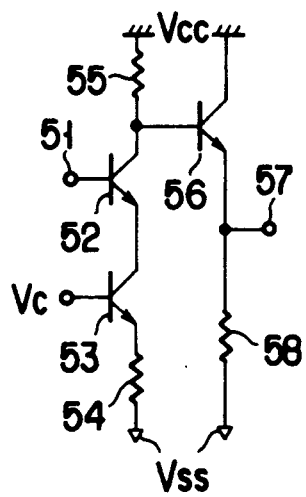
FIGS. 5A and 5B show modifications of the second reference potential generating circuit shown in FIG. 1.
Figure 5B:
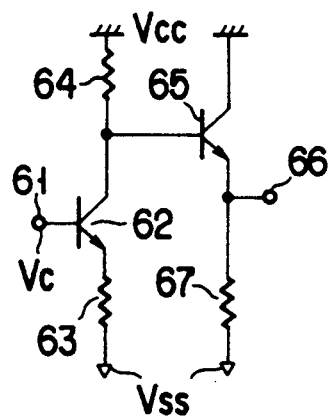
Figure 6:
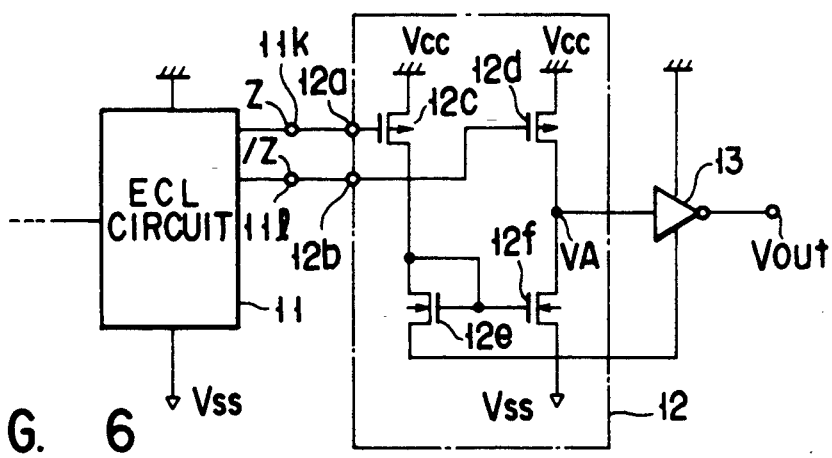
FIG. 6 shows an example of a prior art level translation circuit.
Figure 7:
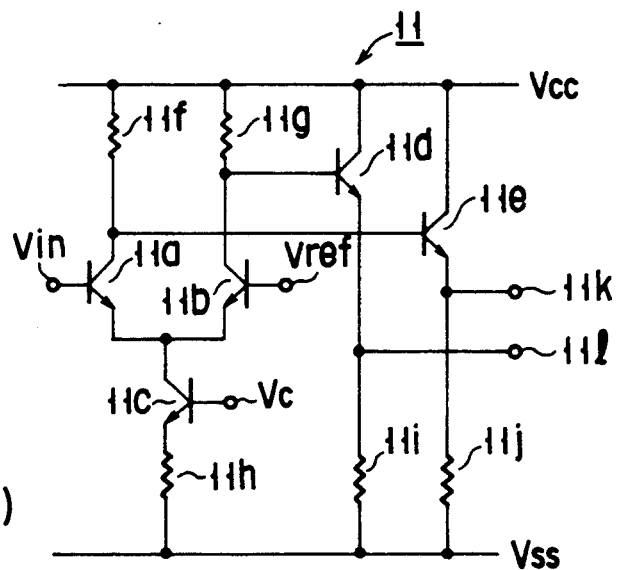
FIG. 7 shows an example of the ECL circuit shown in FIG. 6.
Figure 8:
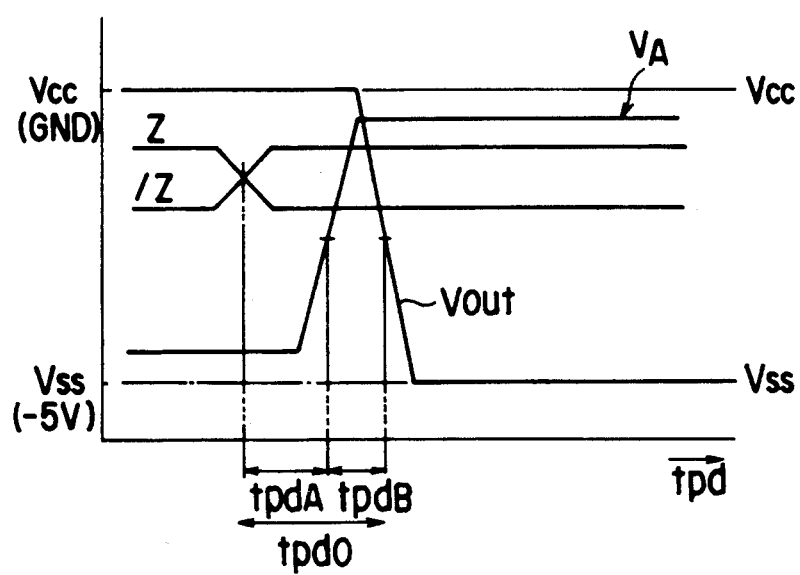
FIG. 8 is a timing chart illustrating the operation of the level translation circuit shown in FIG. 6.

Furthermore, the second reference voltage generating circuit 25 is not restricted to the arrangement shown in FIG. 1 but may be modified as shown in FIG. 5A or 5B.

In FIG. 5A, an input terminal 51, which is supplied with the same signal as the ECL circuit 21, is connected to the base of an NPN transistor 52. The emitter of the transistor 52 is connected to the collector of an NPN transistor 53 forming a constant current source. The transistor 53 has its base connected to a constant potential source Vc and its emitter connected to the second voltage source Vss (−5.0 volts, −5.2 volts, or −4.5 volts) through a resistor 54. The transistor 52 has its collector connected to the first voltage source Vss (GND) through a resistor 55 and to the base of an NPN transistor 56. The transistor 56 has its collector connected to the first voltage source Vcc and its emitter connected to an output terminal 57 and to the second voltage source Vss through a resistor 58.

In FIG. 5B, on the other hand, an input terminal 61, which is connected to a constant potential source Vc, is connected to the base of an NPN transistor 62. The transistor 62 has its emitter connected to the second voltage source Vss through a resistor 63 and its collector connected to the first voltage source Vcc through a resistor 64 and to the base of an NPN transistor 65. The transistor 65 has its collector connected to the first voltage source Vcc and its emitter connected to an output terminal 66 and to the second voltage source Vss through a resistor 67.

The above embodiments were described in connection with the case where the second voltage source Vss is of negative polarity. It is to be noted, however, that the present invention can also be practiced by the use of a voltage source of positive polarity, for example, Vcc=5.0 volts and Vss=0 volts.

What is claimed is:

1. A level translation circuit comprising:
   a CMOS output circuit having an input terminal, a control signal input terminal, and an output terminal for translating an input voltage at an ECL logic level, directly applied to said input terminal, to an output voltage at a CMOS logic level and outputting said output voltage to said output terminal, said CMOS output circuit having a threshold voltage that is set nearly midway between ECL voltage levels in response to a control signal applied to said control signal input terminal;
   a first reference voltage generating circuit having a control signal input terminal and an output terminal for generating a voltage proportional to said threshold voltage of said CMOS output circuit as a first reference voltage and outputting it to its output terminal, said first reference voltage generating circuit being responsive to said control signal applied to its control signal input terminal to vary said first reference voltage;
   a second reference voltage generating circuit, composed of bipolar transistors, for generating a potential midway between the ECL logic levels as a second reference voltage; and
   a comparator having a first input terminal connected to receive said first reference voltage output from said first reference voltage generating circuit, a second input terminal connected to receive said second reference voltage output from said second reference voltage generating circuit, and an output terminal connected to said control signal input terminals of said CMOS output circuit and said first reference voltage generating circuit, said comparator making a comparison between said first and second reference voltages to output said control signal for controlling said CMOS output circuit and said first reference voltage generating circuit so that said first and second reference voltages may become equal to each other.

2. A circuit according to claim 1, in which said CMOS output circuit comprises:
   a transistor of a first conductivity type having gate connected to said input terminal, its source connected to a first voltage source, and its drain connected to said output terminal;
   a first transistor of a second conductivity type having gate connected to said input terminal and its drain connected to said output terminal; and
   a second transistor of said second conductivity type having conduction path, defined by its source and drain, connected between a source of said first transistor of said second conductivity type and a second voltage source and its gate connected to said control signal input terminal to receive said control signal output from said comparator.

3. A circuit according to claim 1, in which said first reference voltage generating circuit comprises:
   a transistor of a first conductivity type having gate and drain connected to said output terminal and its source connected to a first voltage source;
   a first transistor of a second conductivity type having gate and drain connected to said output terminal; and
   a second transistor of said second conductivity type having its conduction path, defined by its drain and source, connected between a source of said first transistor of said second conductivity type and a second voltage source and its gate connected to said control signal input terminal to receive said control signal output from said comparator.

4. A circuit according to claim 1, in which said CMOS output circuit comprises:
   a first transistor of a first conductivity type having gate connected to said input terminal and its drain connected to said output terminal;
   a transistor of a second conductivity type having gate connected to said input terminal, its source connected to a second voltage source, and its drain connected to said output terminal; and
   a second transistor of said first conductivity type having conduction path, defined by its source and drain, connected between a source of said first transistor of said first conductivity type and a first voltage source and its gate connected to said control signal input terminal to receive said control signal from said comparator.

5. A circuit according to claim 1, in which said first reference voltage generating circuit comprises:
   a first transistor of a first conductivity type having gate and drain connected to said output terminal;
   a transistor of a second conductivity type having gate and drain connected to said output terminal and its source connected to a second voltage source; and
   a second transistor of said first conductivity type having conduction path, defined by its drain and source, connected between a source of said first transistor of said first conductivity type and a first voltage source and its gate connected to said control signal input terminal to receive said control signal output from said comparator.

6. A circuit according to claim 1, in which said CMOS output circuit comprises:
   a first transistor of a first conductivity type having gate connected to said input terminal and its drain connected to said output terminal;
   a second transistor of said first conductivity type having conduction path connected between a source of said first transistor of said first conductivity type and a first voltage source gate and its gate connected to said control signal input to receive said control signal output from said comparator;
   a first transistor of a second conductivity type having gate connected to said input terminal and its drain connected to said output terminal; and
   a second transistor of said second conductivity type having conduction path, defined by its source and drain, connected between a source of said first transistor of said second conductivity type and a second voltage source and its gate connected to said control signal input terminal to receive said control signal from said comparator.

7. A circuit according to claim 1, in which said first reference voltage generating circuit comprises:
   a first transistor of a first conductivity type having gate and drain connected to said output terminal;
   a second transistor of said first conductivity type having conduction path connected between a source of said first transistor of said first conductivity type and a first voltage source and its gate connected to said control signal input terminal to receive said control signal output from said comparator;
   a first transistor of a second conductivity type having gate and drain connected to said output terminal; and
   a second transistor of said second conductivity type having conduction path, defined by its drain and source, connected between a source of said first transistor of said second conductivity type and a second voltage source and its gate connected to said control signal input terminal to receive said control signal output from said comparator.

8. A circuit according to claim 1, in which said second reference voltage generating circuit comprises:
   first and second NPN transistors having their bases connected to an input terminal receiving said voltage at an ECL logic level, their emitters connected to a second voltage source through a constant current source, and their collectors each connected to a first voltage source through a resistor; and
   a third NPN transistor having its base connected to the collector of said second NPN transistor, its collector connected to said first voltage source, and its emitter connected to said second voltage source through a resistor and to said second input terminal of said comparator.

9. A circuit according to claim 1, in which said second reference voltage generating circuit comprises:
   a first NPN transistor having base connected to an input terminal receiving said voltage at an ECL logic level, its emitter connected to a second voltage source through a constant current source, and its collector connected to a first voltage source through a resistor; and
   a second NPN transistor having base connected to the collector of said first NPN transistor, its collector connected to said first voltage source, and its emitter connected to said second voltage source through a resistor and to said second input terminal of said comparator.

10. A circuit according to claim 1, in which said second reference voltage generating circuit comprises:
   a constant current source having its one end connected to a first voltage source and its other end connected to a second voltage source; and
   an NPN transistor having base connected to said one end of said constant current source, its collector connected to said first voltage source, and its emitter connected to said second voltage source through a resistor and to said second input terminal of said comparator.

11. A level translation circuit comprising:
   a CMOS output circuit having an input terminal, a control signal input terminal, an output terminal, a CMOS inverter circuit connected between said input and output terminals for translating a voltage at an ECL logic level directly applied to said input terminal to a voltage at a CMOS logic level and outputting it to said output terminal, and a MOS transistor having its conduction path connected between said CMOS inverter circuit and a voltage source and its gate connected to said control signal input terminal, said MOS transistor being responsive to a control signal applied to said control signal input terminal to vary a threshold voltage of said CMOS inverter circuit;
   a first reference voltage generating circuit having a control signal input terminal and an output terminal, said first reference voltage generating circuit including a MOS transistor of a first conductivity type and a first MOS transistor of a second conductivity type having their conduction paths connected in series with a connection point therebetween connected to said output terminal and their gates connected to said output terminal and generating and outputting to said output terminal a threshold voltage depending on the dimensional ratio between said MOS transistors as a first reference voltage, said first reference voltage generating circuit further including a second MOS transistor of said second conductivity type having its conduction path at its one end connected to said conduction path of said first MOS transistor and its gate connected to said control signal input terminal, said second MOS transistor being responsive to a control signal applied to said control signal input terminal to vary said threshold voltage;
   a second reference voltage generating circuit composed of bipolar transistors for generating a potential midway between ECL logic levels as a second reference voltage; and
   a comparator having first and second input terminals connected to said first and second reference voltage generating circuits, respectively, and an output terminal connected to said control signal input terminal of the CMOS output circuit and said control signal input terminal of the first reference voltage generating circuit, said comparator making a comparison between said first and second reference voltages to output to said output terminal said control signal for controlling said CMOS output circuit and said first reference voltage generating circuit so that said first and second reference voltages may become equal to each other.

12. A level translation circuit comprising:
   a CMOS output circuit having an input terminal, an control signal input terminal and an output terminal for translating a voltage at an ECL logic level directly applied to said input terminal to a voltage at a CMOS logic level and outputting it to said output terminal, said CMOS output circuit having a threshold voltage that is set nearly midway between ECL logic levels in accordance with a control signal applied to said control signal input terminal;
   a first reference voltage generating circuit having a control signal input terminal and an output terminal for generating a voltage proportional to said threshold voltage of said CMOS output circuit as a first reference voltage and outputting it to said output terminal, said first reference voltage generating circuit being responsive to a control signal applied to said control signal input terminal to vary said first reference voltage;
   a second reference voltage generating circuit composed of bipolar transistors for generating a potential midway between ECL logic levels as a second reference voltage; and
   a comparator having a first input terminal connected to receive said first reference voltage from said first reference voltage generating circuit, a second input terminal connected to receive said second reference voltage from said second reference voltage generating circuit, and an output terminal connected said control signal input terminals of said CMOS output circuit and said first reference voltage generating circuit, said comparator making a comparison between said first and second reference voltages to output to said output terminal said control signal for controlling said CMOS output circuit and said first reference voltage generating circuit so that said first and second reference voltages may become equal to each other,
   said CMOS output circuit including:
   a transistor of a first conductivity type having gate connected to said input terminal, its source connected to a first voltage source, and its drain connected to said output terminal;
   a first transistor of a second conductivity type having gate connected to said input terminal and its drain connected to said output terminal; and
   a second transistor of said second conductivity type having conduction path, defined by its source and drain, connected between a source of said first transistor of said second conductivity type and a second voltage source and its gate connected to said control signal input terminal to receive said control signal output from said comparator,
   said first reference voltage generating circuit including:
   a second transistor of said first conductivity type having gate and drain connected to said output terminal and its source connected to said first voltage source;
   a third transistor of said second conductivity type having gate and drain connected to said output terminal; and
   a fourth transistor of said second conductivity type having conduction path, defined by its drain and source, connected between a source of said third transistor of said second conductivity type and said second voltage source and its gate connected to said control signal input terminal to receive said control signal output from said comparator, said second reference voltage generating circuit including:

first and second NPN transistors having their bases connected to an input terminal receiving said voltage at an ECL logic level, their emitters connected to said second voltage source through a constant current source, and their collectors each connected to said first voltage source through a resistor; and a third NPN transistor having its base connected to the collector of said second NPN transistor, its collector connected to said first voltage source, and its emitter connected to said second voltage source through a resistor and to said second input terminal of said comparator.

* * * * *

UNITED STATES PATENT AND TRADEMARK OFFICE
CERTIFICATE OF CORRECTION

PATENT NO. : 5,369,318
DATED : November 29, 1994
INVENTOR(S) : Tadahiro KURODA et al It is certified that error appears in the above-indentified patent and that said Letters Patent is hereby corrected as shown below:

On the title page: Item [73]

Change Assignee's address from "Tokyo, Japan" to --Kawasaki, Japan--.

Signed and Sealed this

Sixth Day of June, 1995

Attest:

BRUCE LEHMAN

Attesting Officer     Commissioner of Patents and Trademarks